United States Patent
Lee

(10) Patent No.: US 10,108,342 B2
(45) Date of Patent: Oct. 23, 2018

(54) METHOD FOR REDUCING USE OF DRAM IN SSD AND THE SSD USING THE SAME

(71) Applicant: Storart Technology Co., Ltd., Hsinchu (TW)

(72) Inventor: Hou Yun Lee, Hsinchu (TW)

(73) Assignee: Storart Technology Co. Ltd., Hsinchu (TW)

(*) Notice: Subject to any disclaimer, the term of this patent is extended or adjusted under 35 U.S.C. 154(b) by 174 days.

(21) Appl. No.: 15/189,025

(22) Filed: Jun. 22, 2016

(65) Prior Publication Data

US 2017/0371555 A1 Dec. 28, 2017

(51) Int. Cl.
*G06F 3/06* (2006.01)
*G11C 7/10* (2006.01)

(52) U.S. Cl.
CPC ............ *G06F 3/0608* (2013.01); *G06F 3/065* (2013.01); *G06F 3/0688* (2013.01); *G11C 7/1072* (2013.01)

(58) Field of Classification Search
CPC ....... G06F 3/0608; G06F 3/065; G06F 3/0688
See application file for complete search history.

(56) References Cited

U.S. PATENT DOCUMENTS

2012/0246388 A1* 9/2012 Hashimoto ......... G06F 12/0246
711/103

* cited by examiner

*Primary Examiner* — Reginald Bragdon
*Assistant Examiner* — Mehdi Namazi
(74) *Attorney, Agent, or Firm* — Che-Yang Chen; Law Offices of Scott Warmuth

(57) ABSTRACT

A SSD and a method for reducing use of DRAM in the SSD are disclosed. The method includes the steps of: A. providing a referring table in a DRAM module of a SSD; B. providing a logical-to-physical address table in the DRAM module; C. receiving a command for accessing a target data in a target logical address of the SSD; D. checking if one physical address is stored in the logical-to-physical address table; E. executing the command by using the mapping data in the subgroup or copying a corresponding subgroup including one mapping data for the target logical address from the mapping table to the DRAM module via the referring table; and; and F. adding a target physical address of the DRAM module where the mapping data for the target logical address is stored to the logical-to-physical address table so that the target logical address is able to correspond thereto.

14 Claims, 3 Drawing Sheets

METHOD FOR REDUCING USE OF DRAM IN SSD AND THE SSD USING THE SAME

FIELD OF THE INVENTION

The present invention relates to a method for reducing use of DRAM (Dynamic Random Access Memory). More particularly, the present invention relates to a method for reducing use of DRAM in a SSD (Solid State Disk) and the SSD structure using the method.

BACKGROUND OF THE INVENTION

Flash memory is widely used in storing digital data nowadays. It has many aspects of applications: flash memory chips can be aggregated to form a SSD to be a key part of a notebook, or a pen drive as a portable storage device; one single flash memory chip may be packaged to form a micro SD card inserted in a smartphone for recording data. Take SSD as an example. Comparing with HDD (Hard Disk Drive), SSD has advantages of shockproof, compact size, low heat radiation and fast speed of read and write. Although HDD has higher bit-to-cost ratio than SSD, the distance therebetween is getting closer. SSD is replacing HDD to be the mainstream in storage.

In SSDs or other similar storage devices, a mapping table is used to enable read/write performance. Typically, the mapping table is quite large. The full mapping table or subparts of it is used to perform read and write tasks. Hence, it is desired to store the mapping table or subparts in a DRAM module for fast response to read/write instructions. The full mapping table is stored in the flash memory units (pages or blocks) of the SSD before the DRAM module is initiated to download the mapping table or subparts of it to operate. A SSD controller is generally designed and manufactured with said DRAM module. A size of the DRAM module is usually at least 1/1000 of total storage capacity of the flash memory in the SSD. For example, if a SSD has a storage size of 512 GB, thus, a controller for the SSD should have a DRAM module not less than 512 MB. In the past, capacity of SSDs was not large. The required DRAM module is not large, either. Cost of the DRAM module is not significant. With the increase of storage capacity of the SSDs, cost of the DRAM module becomes an unavoidable issue.

The present invention is to provide a solution for settle the issue.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In order to settle the issue mentioned above, a method for reducing use of DRAM in a SSD is disclosed. The method includes the steps of: A. providing a referring table in a DRAM module of a SSD, wherein the referring table has a plurality of physical addresses of subgroups of a mapping table in non-volatile memory units of the SSD, wherein the mapping table has mapping data each for mapping a logical address and a corresponding physical address of the non-volatile memory units of the SSD; each subgroup comprises a portion of all mapping data; B. providing a logical-to-physical address table in the DRAM module of the SSD, wherein the logical-to-physical address table stores a plurality of logical addresses and physical addresses of the DRAM module, wherein each physical address of the DRAM module corresponds to one logical address and refers to one subgroup having one mapping data for the corresponding logical address; C. receiving a command for accessing a target logical address of the non-volatile memory units from a host of the SSD; D. checking if one physical address of the DRAM module corresponding the target logical address is stored in the logical-to-physical address table; E. executing the command by using the mapping data in the subgroup if a result of the step D is yes, or copying a corresponding subgroup including one mapping data for the target logical address from the mapping table to the DRAM module via the referring table for executing the command if the result of the step D is no; and F. adding a target physical address of the DRAM module where the mapping data for the target logical address is stored to the logical-to-physical address table so that the target logical address is able to correspond thereto.

The method may further include a step E1 before F: E1. removing the target logical address which has a minimum priority among all the target logical addresses from the logical-to-physical address table when a maximum storage capacity of the logical-to-physical address table is met. The priority may be set by sorting hit rates of the temporary data which are accessed, arranging recent accesses in sequence or sorting weights which are randomly granted.

The method may further include a step B1 after step B: B1. providing a subgroup address to logical address table in the DRAM module of the SSD, wherein the subgroup address to logical address table stores logical addresses and physical addresses of the DRAM module for the corresponding mapping data of the subgroups. If the accessing of the command is writing, the method further comprises a step E2 before step F: E2. programming data corresponding to the corresponding physical address of the non-volatile memory units according to the subgroup address to logical address table.

Preferably, the non-volatile memory unit may be a flash memory chip in the SSD. The flash memory chip may be a NAND flash memory chip, a NOR flash memory chip, or a charge trap flash memory chip.

According to the present invention, A SSD using the method is further disclosed. The SSD includes: a number of non-volatile memory units; a DRAM module; and a controller, creating a referring table in the DRAM module, wherein the referring table has a plurality of physical addresses of subgroups of a mapping table in the non-volatile memory units, wherein the mapping table has mapping data each for mapping a logical address and a corresponding physical address of the non-volatile memory units; each subgroup comprises a portion of all mapping data; creating a logical-to-physical address table in the DRAM module, wherein the logical-to-physical address table stores a plurality of logical addresses and physical addresses of the DRAM module, wherein each physical address of the DRAM module corresponds to one logical address and refers to one subgroup stored with one mapping data for the corresponding logical address; receiving a command for accessing a target logical address of the non-volatile memory units from a host of the SSD; checking if one physical address of the DRAM module corresponding the target logical address is stored in the logical-to-physical address table; executing the command by using the mapping data in the subgroup if a result of the checking is yes; copying a corresponding subgroup including one mapping data for the target logical address from the mapping table to the DRAM module via the referring table for executing the command if the result of the checking is no; and adding a target physical address of the DRAM module where the mapping data for the target logical address is stored to the logical-to-physical address table so that the target logical address is able to correspond thereto.

Preferably, the controller may further be for removing the target logical address which has a minimum priority among all the target logical addresses from the logical-to-physical address table when a maximum storage capacity of the logical-to-physical address table is met. The priority may be set by sorting hit rates of the temporary data which are accessed, arranging recent accesses in sequence or sorting weights which are randomly granted. The controller may be further for creating a subgroup address to logical address table in the DRAM module, wherein the subgroup address to logical address table stores logical addresses and physical addresses of the DRAM module for the corresponding mapping data of the subgroups. If the accessing of the command is writing, the controller is further for programming data corresponding to the corresponding physical address of the non-volatile memory units according to the subgroup address to logical address table.

Preferably, the non-volatile memory unit may be a flash memory chip in the SSD. The flash memory chip may be a NAND flash memory chip, a NOR flash memory chip, or a charge trap flash memory chip.

Comparing with conventional SSD, the method and SSD architecture provided by the present invention doesn't have to copy the whole mapping table from the flash memory chip to the DRAM module in the SSD. Therefore, DRAM size can be reduced.

DETAILED DESCRIPTION OF THE PREFERRED EMBODIMENTS

The present invention will now be described more specifically with reference to the following embodiments.

Figure 1:
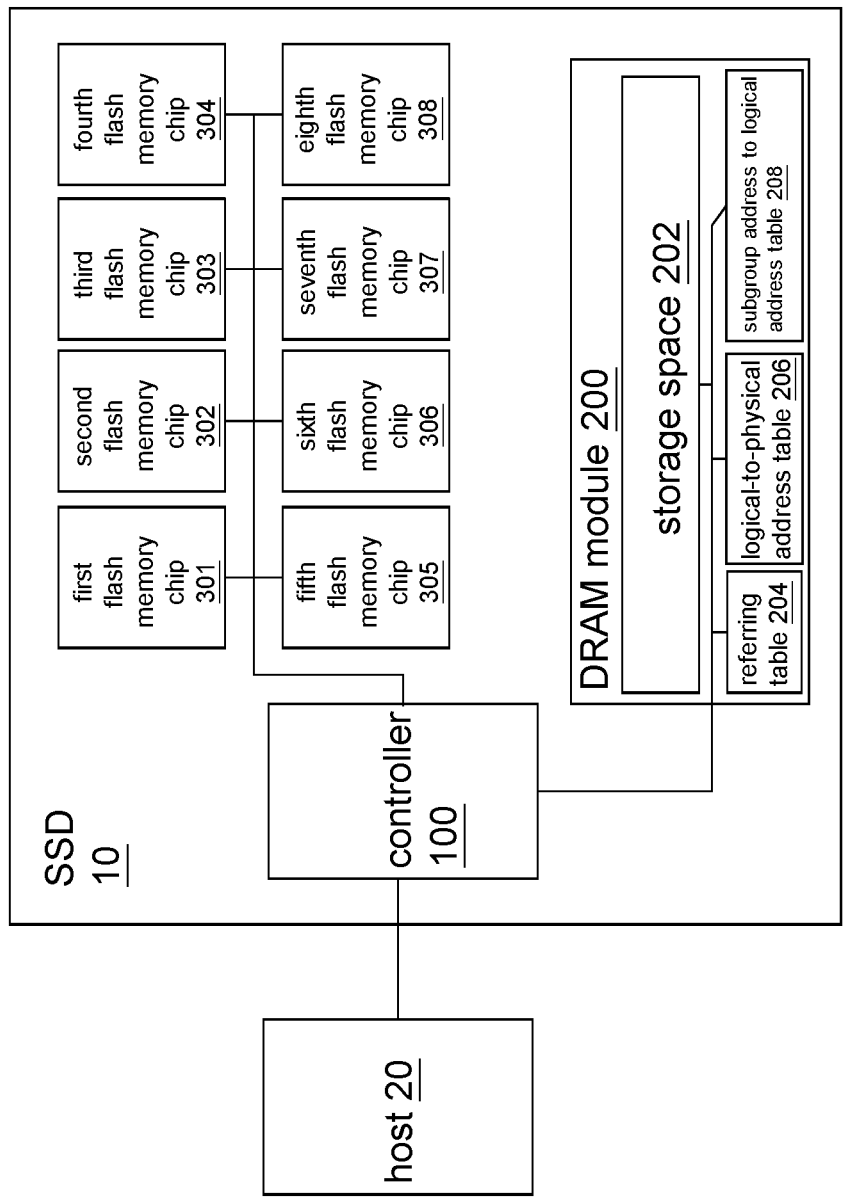
FIG. 1 is a schematic diagram of a SSD according to the present invention.

Please refer to FIG. 1. An embodiment of a SSD 10 which can reduce DRAM according to the present invention is disclosed. The SSD 10 is used to store data for accessing (reading and writing). Therefore, the SSD 10 may have a number of non-volatile memory units. The number of non-volatile memory units depends on the capacity of the SSD 10. Storage capacity of each non-volatile memory unit is not limited. In fact, the non-volatile memory unit may be a flash memory chip. Preferably, the flash memory chip may be a NAND flash memory chip, a NOR flash memory chip, or a charge trap flash memory chip. This is not restricted by the present invention.

In the present embodiment, the SSD 10 includes 8 flash memory chips (a first flash memory chip 301, a second flash memory chip 302, a third flash memory chip 303, a fourth flash memory chip 304, a fifth flash memory chip 305, a sixth flash memory chip 306, a seventh flash memory chip 307 and an eighth flash memory chip 308), a DRAM module 200 and a controller 100. The controller 100 has many functions. According to the present invention, the main functions are creating a referring table 204 in the DRAM module 200 (the referring table 204 has a number of physical addresses of subgroups of a mapping table in the flash memory chips; the mapping table has mapping data each for mapping a logical address and a corresponding physical address of the flash memory chips; each subgroup comprises a portion of all mapping data), creating a logical-to-physical address table 206 in the DRAM module 200 (the logical-to-physical address table stores a number of logical addresses and physical addresses of the DRAM module 200; each physical address of the DRAM module 200 corresponds to one logical address and refers to one subgroup that one mapping data for the corresponding logical address), receiving a command for accessing a target logical address of the flash memory chips from a host 20 of the SSD 10, checking if one physical address of the DRAM module 200 corresponding the target logical address is stored in the logical-to-physical address table 206, accessing the command by using the mapping data in the subgroup if a result of the checking is yes, copying a corresponding subgroup including one mapping data for the target logical address from the mapping table to the DRAM module 200 via the referring table 204 for accessing the command if the result of the checking is no, adding a target physical address of the DRAM module 200 where the mapping data for the target logical address is stored to the logical-to-physical address table 206, so that the target logical address is able to correspond to the added target physical address, removing the target logical address which has a minimum priority (the priority is set by sorting hit rates of the temporary data which are accessed, arranging recent accesses in sequence or sorting weights which are randomly granted) among all the target logical addresses from the logical-to-physical address table 206 when a maximum storage capacity of the logical-to-physical address table 206 is met, creating a subgroup address to logical address table 208 in the DRAM module 200 (the subgroup address to logical address table 208 stores logical addresses and physical addresses of the DRAM module 200 for the corresponding mapping data of the subgroups) and programming data corresponding to the corresponding physical address of the flash memory chips according to the subgroup address to logical address table 208 if the accessing of the command is writing. A method for reducing use of DRAM module 200 in the SSD 10 is basically implemented by the controller 100. Therefore, the operation (functions used) of the controller 100 along with the SSD 10 will be described in detail by the illustration of the method for different scenarios below.

Figure 2:
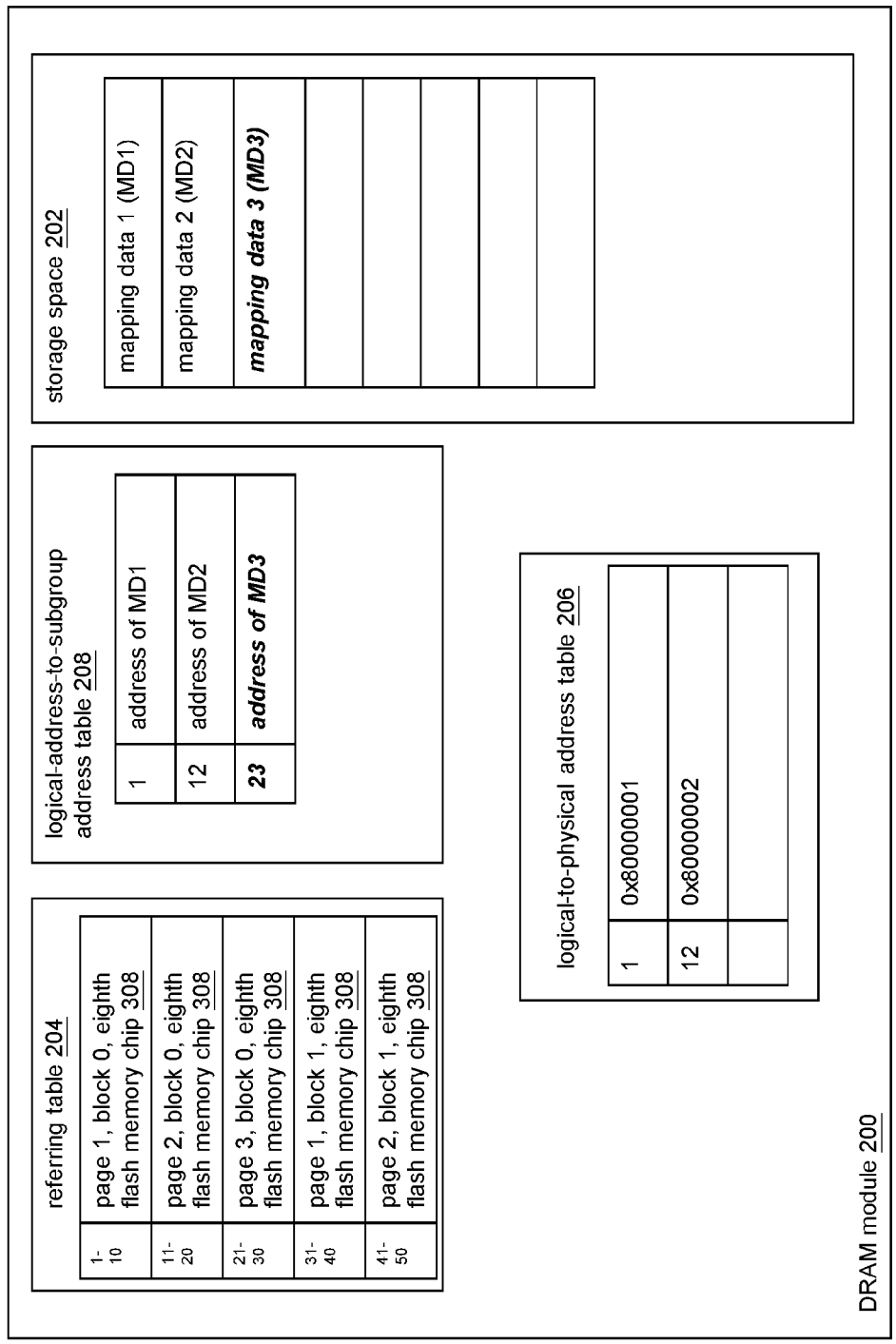
FIG. 2 shows an example of data structure of a DRAM module.
Figure 3:
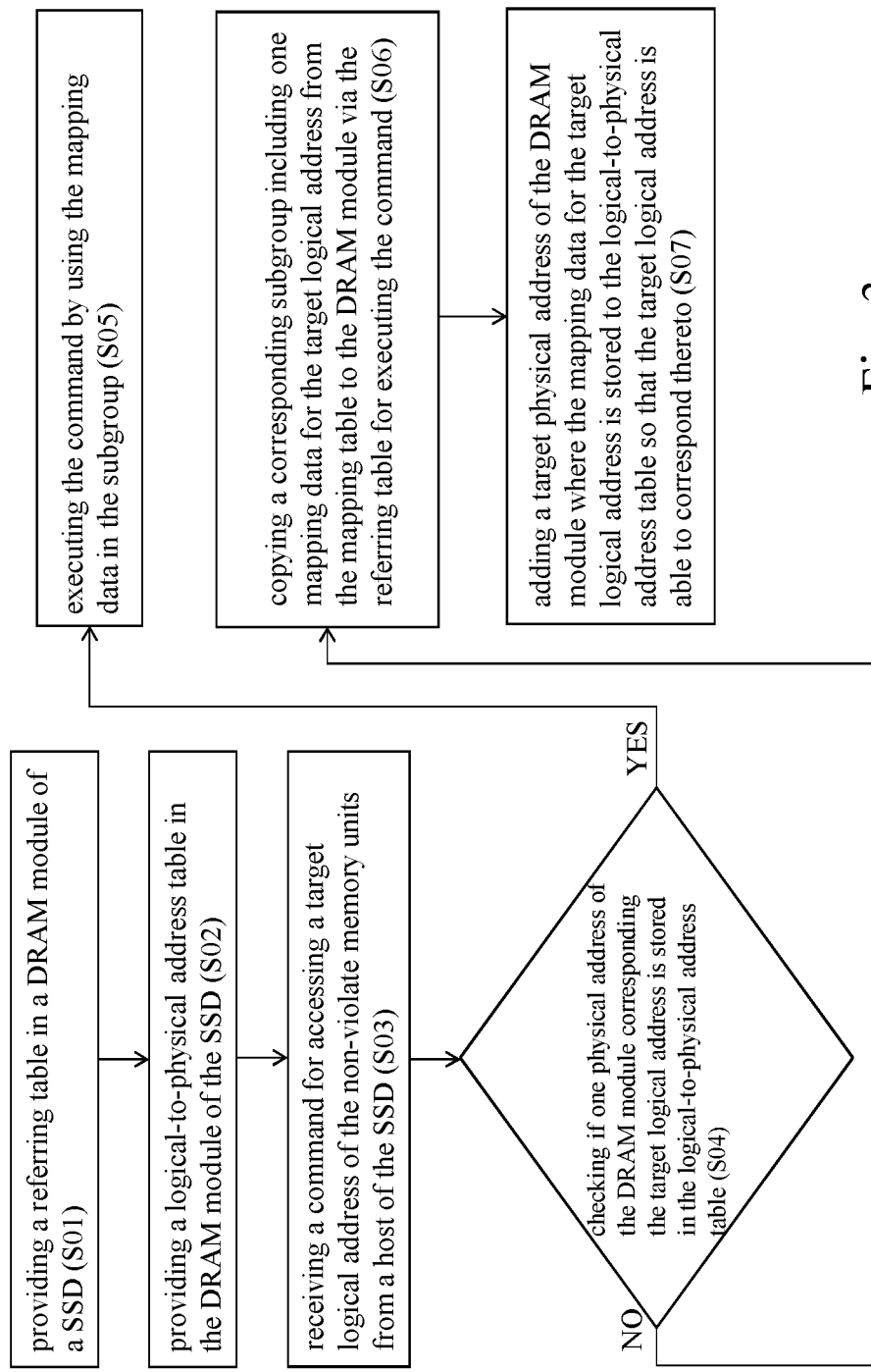
FIG. 3 is a flow chart of the steps of the method provided by the present invention.

Please see FIG. 3. It is a flow chart of the steps of the method provided by the present invention. The first step is to provide the referring table 204 in the DRAM module 200 of the SSD 10 (S01). It is clear that the referring table 204 must be created since there is no data left in the DRAM module 200 in the beginning of power-on. The referring table 204 has a number of physical addresses of subgroups of the mapping table in the flash memory chips of the SSD 10. The mapping table is for mapping logical addresses and corresponding physical addresses in the flash memory chips of the SSD 10. It is quite large. Therefore, the mapping table is usually separated into many subgroups and stored in a number of locations (physical addresses of the flash memory chips). In order to have a comprehensive understanding about this, please see FIG. 2. FIG. 2 shows an example of data structure of the DRAM module 200. The referring table 204 has two fields. One of the two keeps the physical addresses (page 1 of block 0 of the eighth flash memory chip 308, page 2 of block 0 of the eighth flash memory chip 308, page 3 of block 0 of the eighth flash memory chip 308, page 1 of block 1 of the eighth flash memory chip 308, and page 2 of block 1 of the eighth flash memory chip 308) of the mapping table in the flash memory chips of the SSD 10 while the other one indicates the logical addresses of the mapping data of each subgroup. For example, "1-10" means logical address 1 to logical address 10 in the mapping data of a first subgroup. Page 2 of block 0 of the eighth flash memory chip 308 stores the mapping data for logical address 1 to logical address 10. Of course, the arrangement of the referring table 204 may have more logical addresses in one subgroup. It may only have one logical address in each subgroup. It is not limited by the present invention.

Then, provide the logical-to-physical address table 206 in the DRAM module 200 of the SSD 10 (S02). The logical-to-physical address table 206 stores a number of logical addresses and physical addresses of the DRAM module 200. In FIG. 2, a logical address 1 corresponds to physical address of 0x80000001 and a logical address 12 corresponds to physical address of 0x80000002. 0x80000001 of the DRAM module 200 keeps the mapping data for the logical address 1. 0x80000002 of the DRAM module 200 keeps the mapping data for the logical address 12. The logical address 1 belongs to the first subgroup while the logical address 12 belongs to a second subgroup of the mapping table. Each physical address of the DRAM module 200 corresponds to one logical address and refers to one subgroup that one mapping data for the corresponding logical address. A storage space 202 includes the physical addresses of the DRAM module 200 referred by the logical-to-physical address table 206 and is for temporarily storing the mapping data. Now, the storage space 202 has the mapping data 1 (MD1) and the mapping data 2 (MD2). Mapping data 3 in bold and Italian style will be later provided. Similarly, the logical-to-physical address table 206 needs to be created since it was not there before the DRAM module 200 is powered on.

A third step is receiving a command for accessing a target logical address of the flash memory chips from a host 20 of the SSD 10 (S03). Accessing may refer to reading or writing. For some processes, reading and writing are the same. Differences will be pointed out later in the operating examples. Mapping data of the target logical address may be available in the logical-to-physical address table 206, e.g. 0x80000001 and 0x80000002. Mapping data of the target logical address may not be kept in the logical-to-physical address table 206. If a target logical address, 23, is requested to access, since it is not in the logical-to-physical address table 206, further steps must be done. Therefore, it has to check if one physical address of the DRAM module 200 corresponding the target logical address is stored in the logical-to-physical address table 206 (S04). If a result of the step S04 is yes, just execute the command by using the mapping data in the subgroup (S05). If the result of the step S04 is no, copy a corresponding subgroup including one mapping data for the target logical address from the mapping table to the DRAM module 200 via the referring table 204 for executing the command (S06). Namely, the mapping table referred by the referring table 204 brings into play its role to find out the physical address of the flash memory chips of the SSD 10 corresponding to the target logical address, 23. The physical address of the flash memory chips of the SSD 10 according to the referring table 204 is in page 3 of block 0 of the eighth flash memory chip 308. In order to access the data of the target logical address, 23, the controller 100 copies the mapping data 3 (MD3) to the storage space 202. Finally, if copying is carried out, add a physical address of the DRAM module 200 where the mapping data for the target logical address is stored to the logical-to-physical address table 206, so that the target logical address is able to correspond to the added physical address (S07) in the future.

Step S07 is to update the logical-to-physical address table 206 with the new mapping data for the target logical address which was not in the logical-to-physical address table 206 before the command is received. In this embodiment, the number of sets of physical addresses of the DRAM module 200 and corresponding logical address of the logical-to-physical address table 206 is 3. Although it might be more in other embodiments, the number is limited. When a maximum storage capacity of the logical-to-physical address table 206 is met but commands for accessing new target logical addresses are still received, a further step for the method is required. In another embodiment, when a maximum storage capacity of the logical-to-physical address table 206 is met, remove the target logical address which has a minimum priority among all the target logical addresses from the logical-to-physical address table 206. This step can be added before step S07. It is to say that the least used or important target logical address judged by the priority should be removed from the logical-to-physical address table 206. For example, the priority may be set by sorting hit rates of the temporary data which are accessed (the target logical address of the least-hit-rate temporary data should be removed). The priority may also be set by arranging recent accesses in sequence (the target logical address of the least-accessed temporary data should be removed). Furthermore, the priority may be set by sorting weights which are randomly granted to each target logical address.

As mentioned above, according to the present invention, accessing may include reading and writing. If the command is a writing command, a further step is required after step S02: providing the subgroup address to logical address table 208 in the DRAM module 200 of the SSD10. The subgroup address to logical address table 208 stores logical addresses and physical addresses of the DRAM module 200 for the corresponding mapping data of the subgroups. As shown in FIG. 2, the subgroup address to logical address table 208 originally stored logical addresses of 1 and 12 and the mapping data of the subgroups 1 and 2 (MD1 and MD2). Now, new logical address 3 and physical addresses of the DRAM module 200 for the subgroup 3 are added to the subgroup address to logical address table 208. The function of the subgroup address to logical address table 208 is to speed up programming data to the flash memory chips. Programming may be an independent step before step S07: programming data corresponding to the corresponding physical address of the flash memory chips according to the subgroup address to logical address table 204. For example, if the content of logical address 23 is changed, the changed data will be programmed into a new physical address of page 0 to page 3 of block 0 of the third flash memory chip 303. The previous physical address for storing the original data may be page 0 to page 3 of block 15 of the third flash memory chip 303. Correct physical address for new data is always tracked and kept by the mapping table.

Comparing with conventional SSD, the method and SSD architecture provided by the present invention doesn't have to copy the whole mapping table from the flash memory chip to the DRAM module in the SSD. Therefore, DRAM size can be reduced. Cost of the SSD can be reduced, too. Meanwhile, due to the use of the referring table 204 and increasing I/O ability of flash memory chips, speed of locating the physical addressed of data being accessed by the command is not far from that is done by the DRAM module.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A method for reducing use of DRAM (Dynamic Random Access Memory) in a SSD (Solid State Disk), comprising the steps of:
   A. providing a referring table in a DRAM module of a SSD, wherein the referring table has a plurality of physical addresses of subgroups of a mapping table in non-volatile memory units of the SSD, wherein the mapping table has mapping data each for mapping a logical address and a corresponding physical address of the non-volatile memory units of the SSD; each subgroup comprises a portion of all mapping data;
   B. providing a logical-to-physical address table in the DRAM module of the SSD, wherein the logical-to-physical address table stores a plurality of logical addresses and physical addresses of the DRAM module, wherein each physical address of the DRAM module corresponds to one logical address and refers to one subgroup having one mapping data for the corresponding logical address;
   C. receiving a command for accessing a target logical address of the non-volatile memory units from a host of the SSD;
   D. checking if one physical address of the DRAM module corresponding the target logical address is stored in the logical-to-physical address table;
   E. executing the command by using the mapping data in the subgroup if a result of the step D is yes, or copying a corresponding subgroup including one mapping data for the target logical address from the mapping table to the DRAM module via the referring table for executing the command if the result of the step D is no; and
   F. adding a target physical address of the DRAM module where the mapping data for the target logical address is stored to the logical-to-physical address table so that the target logical address is able to correspond thereto.

2. The method according to claim 1, further comprising a step E1 before step F: E1. removing the target logical address which has a minimum priority among all the target logical addresses from the logical-to-physical address table when a maximum storage capacity of the logical-to-physical address table is met.

3. The method according to claim 2, wherein the priority is set by sorting hit rates of a temporary data which are accessed, arranging recent accesses in sequence or sorting weights which are randomly granted.

4. The method according to claim 1, further comprising a step B1 after step B: B1. providing a subgroup address to logical address table in the DRAM module of the SSD, wherein the subgroup address to logical address table stores logical addresses and physical addresses of the DRAM module for a corresponding mapping data of the subgroups.

5. The method according to claim 4, wherein if the accessing of the command is writing, the method further comprises a step E2 before step F: E2. programming data corresponding to a corresponding physical address of the non-volatile memory units according to the subgroup address to logical address table.

6. The method according to claim 1, wherein the non-volatile memory unit is a flash memory chip in the SSD.

7. The method according to claim 6, wherein the flash memory chip is a NAND flash memory chip, a NOR flash memory chip, or a charge trap flash memory chip.

8. A SSD, comprising:
   a plurality of non-volatile memory units;
   a DRAM module; and
   a controller, for
      creating a referring table in the DRAM module, wherein the referring table has a plurality of physical addresses of subgroups of a mapping table in the non-volatile memory units, wherein the mapping table has mapping data each for mapping a logical address and a corresponding physical address of the non-volatile memory units; each subgroup comprises a portion of all mapping data;
      creating a logical-to-physical address table in the DRAM module, wherein the logical-to-physical address table stores a plurality of logical addresses and physical addresses of the DRAM module, wherein each physical address of the DRAM module corresponds to one logical address and refers to one subgroup stored with one mapping data for the corresponding logical address;
      receiving a command for accessing a target logical address of the non-volatile memory units from a host of the SSD;
      checking if one physical address of the DRAM module corresponding the target logical address is stored in the logical-to-physical address table;
      executing the command by using the mapping data in the subgroup if a result of the checking is yes;
      copying a corresponding subgroup including one mapping data for the target logical address from the mapping table to the DRAM module via the referring table for executing the command if the result of the checking is no; and
      adding a target physical address of the DRAM module where the mapping data for the target logical address is stored to the logical-to-physical address table so that the target logical address is able to correspond thereto.

9. The SSD according to claim 8, wherein the controller is further for removing the target logical address which has a minimum priority among all the target logical addresses from the logical-to-physical address table when a maximum storage capacity of the logical-to-physical address table is met.

10. The SSD according to claim 9, wherein the priority is set by sorting hit rates of a temporary data which are accessed, arranging recent accesses in sequence or sorting weights which are randomly granted.

11. The SSD according to claim 8, wherein the controller is further for creating a subgroup address to logical address table in the DRAM module, wherein the subgroup address to logical address table stores logical addresses and physical addresses of the DRAM module for a corresponding mapping data of the subgroups.

12. The SSD according to claim 11, wherein if the accessing of the command is writing, the controller is further for programming data corresponding to a corresponding physical address of the non-volatile memory units according to the subgroup address to logical address table.

13. The SSD according to claim 8, wherein the non-volatile memory unit is a flash memory chip in the SSD.

14. The SSD according to claim 13, wherein the flash memory chip is a NAND flash memory chip, a NOR flash memory chip, or a charge trap flash memory chip.

\* \* \* \* \*